United States Patent [19]
Olsson

[11] Patent Number: 4,941,738
[45] Date of Patent: Jul. 17, 1990.

[54] POLARIZATION INDEPENDENT OPTICAL AMPLIFIER APPARATUS

[75] Inventor: Nils A. Olsson, New Providence, N.J.

[73] Assignee: American Telephone and Telegraph Company, New York, N.Y.

[21] Appl. No.: 225,700

[22] Filed: Jul. 29, 1988

[51] Int. Cl.$^5$ .............................................. G02B 5/30
[52] U.S. Cl. ..................................... 350/377; 350/385; 350/386; 350/387; 350/388; 330/4.3; 370/2; 372/703; 455/606; 455/616
[58] Field of Search ...................... 350/3.64, 375, 376, 350/378, 386, 387, 400, 377, 381, 382, 385, 388, 96.13; 372/9, 20, 26, 27, 33, 19, 703; 330/4.3; 370/2; 455/606, 610, 612, 616

[56] References Cited

U.S. PATENT DOCUMENTS

| | | | |
|---|---|---|---|
| 3,597,695 | 8/1971 | Swain et al. | 330/4.3 |
| 4,019,151 | 4/1977 | Brueckner | 350/388 |
| 4,321,550 | 3/1982 | Evtuhou | 372/9 |
| 4,344,042 | 8/1982 | Hon | 372/33 |
| 4,441,186 | 4/1984 | Erickson | 372/19 |
| 4,637,026 | 1/1987 | Liu | 372/27 |
| 4,637,027 | 1/1987 | Shirasaki et al. | 372/27 |
| 4,734,911 | 3/1988 | Bruesselback | 372/33 |

FOREIGN PATENT DOCUMENTS

| | | | |
|---|---|---|---|
| 58-105129 | 6/1983 | Japan | 350/375 |
| 2143337 | 2/1985 | United Kingdom | 350/375 |

OTHER PUBLICATIONS

Y. Mitsuhashi et al., "Polarization-Rotated Optical Feedback in Self-Coupled Optical Pickup", Optics Communications, vol. 34, No. 3, 9/80, pp. 309-310.
Brueckner et al., "Double Pass Lasers Amplifiers," Applied Optics, Oct. 1974, vol. 13, No. 10, pp. 2183-2185.
"A Polarization-Independent Optical Circulator for 1.3 um", Journal of Lightwave Technology, vol. LT-1, No. 3, W. L. Emkey, Sep. 1983, pp. 466-469.
"Optical Amplifier Configurations with Low Polarization Sensitivity", Electronics Letters, Dec. 3, 1987, vol. 23, No. 25, pp. 1387-1388, G. Grobkopf et al.

Primary Examiner—Bruce Y. Arnold
Assistant Examiner—R. D. Shafer
Attorney, Agent, or Firm—Michael J. Urbano

[57] ABSTRACT

A polarization independent semiconductor amplifier is used in a double-pass configuration; that is, the output of the amplifier is passed through a 45° Faraday rotator to a mirror and then through the rotator and the amplifier again. Polarization independent gain is thus achieved.

7 Claims, 1 Drawing Sheet

POLARIZATION INDEPENDENT OPTICAL AMPLIFIER APPARATUS

BACKGROUND OF THE INVENTION

This invention relates to optical amplifiers and, more particularly, to such amplifiers in which the gain differs depending on whether the electromagnetic mode (i.e., polarization) of the radiation being amplified is transverse electric (TE) or transverse magnetic (TM). Included in this class of amplifiers are semiconductor optical amplifiers in which the radiation is guided in a waveguide having an asymmetric cross-section.

A major obstacle for the utilization of semiconductor optical amplifiers in lightwave communication systems is the polarization dependence of the optical gain. Typically, the difference in gain between the TE and TM modes in several dB. In the laboratory, the polarization can be easily controlled by twisting bulky fiber loops in the light path so that only one mode (TE) enters the amplifier. In the field, however, lightwave systems must operate unattended for long periods of time and twisted fiber loops are not principal; either active polarization controllers or polarization independent amplifiers are required. Because of the added complexity and cost associated with active polarization controllers, a polarization independent amplifier is the preferred approach.

One proposal for achieving polarization independence is to use two semiconductor amplifiers in parallel, one for each polarization. As described by G. Grobkopf et al, *Electron Lett.*, Vol. 23, p. 1387 (1987), the input radiation, which is composed of both TE and TM modes, is split into two paths, separately amplified, and then recombined. However, because of the added complexity of having two optical amplifiers and two couplers, it would be advantageous to have a scheme that requires only one amplifier and one coupler.

SUMMARY OF THE INVENTION

In accordance with one aspect of the invention, which is called a Polarization Independent Configuration Optical (PICO) amplifier apparatus, a polarization dependent amplifier is used in a double-pass configuration so that any input radiation will be amplified by an amount approximately equal to the average of the gains for the TE and TM modes. In one embodiment, the radiation output of the polarization dependent amplifier has its polarization rotated by essentially 90°, so that the TE and TM modes are interchanged, before it is re-amplified by the same polarization dependent amplifier. The gain disparity between the two modes is thereby greatly reduced (e.g., from 4 dB to 0.2 dB, a factor of 20 in dB), and essentially polarization independent amplification is achieved.

BRIEF DESCRIPTION OF THE DRAWING

The invention, together with its various features and advantages, can be readily understood from the following more detailed description taken in conjunction with accompanying drawings, in which.

DETAILED DESCRIPTION

Figure 1:
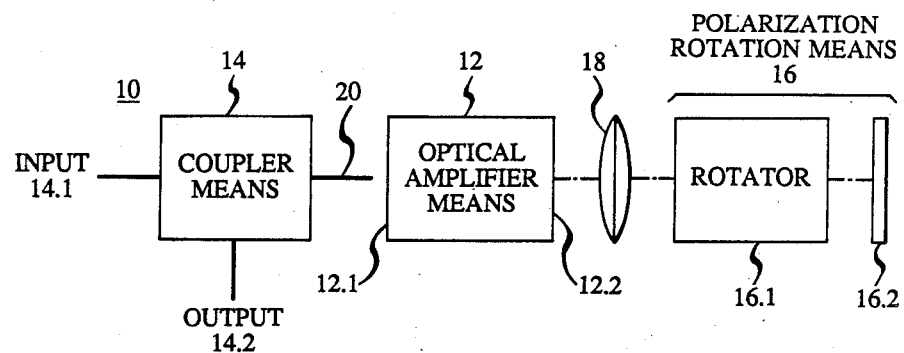
FIG. 1 is a schematic, block diagrammatic view of a PICO amplifier apparatus in accordance with one embodiment of the invention.

Turning now to FIG. 1, there is shown PICO amplifier apparatus 10 which includes a polarization dependent optical amplifier means 12; that is, at least one optical amplifier which exhibits a difference in gain depending on whether the radiation to be amplified is oscillating in a TE mode or a TM mode. Means 12 could, for example, include several amplifiers in tandem at least one of which has such polarization dependent gain.

The radiation to be amplified is applied to one end 12.1 of the amplifier means 12 illustratively via an optical coupler means 14 which includes an input port 14.1 and an output port 14.2 for, respectively, applying an input optical signal and extracting an output optical signal from apparatus 10.

A significant aspect of the invention is the operation of the polarization dependent optical amplifier means 12 in a multiple-pass (e.g., double-pass) configuration in such a way that TE and TM modes passing through the amplifier in the forward direction are interchanged in the backward direction. Consequently, the TE and TM modes experience essentially equal gain, on average, after an even number (e.g, two) of passes through amplifier means 12.

To effect this interchange of TE and TM modes, the radiation emanating from the other end 12.2 of amplifier means 12 is passed through polarization rotation means 16 where its polarization is rotated by 90° (or an odd integral multiple thereof) before it passes again through amplifier means 12. In an illustrative embodiment of the invention, polarization rotation means 16 includes a Faraday rotator 16.1 (bulk or thin film type) and a reflector or mirror 16.2. Radiation emanating from end 12.2 of amplifier means 12 is focussed by lens means 18 onto rotator 16.1 which rotates its polarization by 45° in the forward direction. Thereafter, the 45°-rotated radiation is reflected by mirror 16.2 back into rotator 16.1 so that on the second pass therethrough the radiation experiences another 45° rotation of its polarization. The total polarization rotation of both the TM and TE modes is 90°, which means that these modes have been interchanged.

From an analytical standpoint, the total gain $G_{TOT}(TE)$ for radiation in the TE mode will be the product of $G_{TE}$, the TE mode gain, in the forward direction, times $G_{TM}$, the TM mode gain, in the backward direction because the TE mode has been rotated by 90° into TM the mode. Thus, $$G_{TOT}(TE) = G_{TE} \cdot G_{TM} \quad (1)$$

Conversely, the total gain $G_{TOT}(TM)$ for radiation in the TM mode will be $$G_{TOT}(TM) = G_{TM} \cdot G_{TE} \quad (2)$$

Assuming the amplifier to be linear in the range of operation (as it is for many semiconductor optical amplifiers), then $$G_{TM} \cdot G_{TE} = G_{TE} \cdot G_{TM} \quad (3)$$

or $$G_{TOT}(TE) = G_{TOT}(TM) \quad (4)$$

and both the TM and TE modes experience the same gain in apparatus 10 independent of the fact that the $G_{TE}$ and $G_{TM}$ are different in the polarization dependent amplifier means 12. In practice, there may still be some slight polarization dependence, but a substantial improvement has been achieved and it is reasonable to characterize the apparatus as essentially polarization independent.

In order to achieve the above result, the amplifier means 12 should be of the non-resonant type, that is, the ends 12.1 and 12.2 should not be highly reflecting. Thus, where amplifier means 12 is a semiconductor optical amplifier, the end facets of the semiconductor chip should be provided with suitable antireflection coatings well known with art. Preferably, the reflectivity R of such coatings is very low (e.g., $\lesssim 10^{-3}$) and is related to the gain of the single-pass amplifier G as follows:

$$GR \lesssim 0.10 \qquad (5)$$

for a gain ripple of about one dB. This condition should be satisfied for both the TE reflectivity and the TM reflectivity.

EXAMPLE

The following example describes PICO amplifier apparatus of the type shown in FIG. 1, but specific components, materials, device and/or operating parameters are provided by way of illustration only and, unless otherwise indicated, are not intended to limit the scope of the invention.

The amplifier means 12 of FIG. 1 was made from a 500 μm long Channel Substrate Buried Heterostructure (CSBH) laser chip with a quarter wavelength $SiO_x$ anti-reflection coating applied to both facets (ends 12.1 and 12.2). The average TE facet reflectivity was less than $10^{-4}$. The input radiation was coupled to the amplifier chip with a lensed fiber 20 and coupler means 14. The latter comprised a fiber coupler which separated the input and output signals equally on ports 14.1 and 14.2; i.e., this type of coupler is referred to as a 50/50 fiber coupler. The output from the other end 12.2 of the amplifier chip was collimated with a 0.85 NA microscope objective (lens means 18) and sent through a Faraday rotator 16.1 with a rotation angle of 45°. The Faraday rotator was formed from a well-known 1.5 μm optical isolator (a YIG crystal and magnet, but with the polarizers removed). After reflection from the high reflectivity mirror 16.2, the polarization was rotated another 45° and re-entered the amplifier chip, but now with orthogonal polarization to the input signal. The input polarization was adjusted with a well-known fiber polarization controller (not shown) inserted between coupler means 14 and the amplifier chip.

Figure 2:
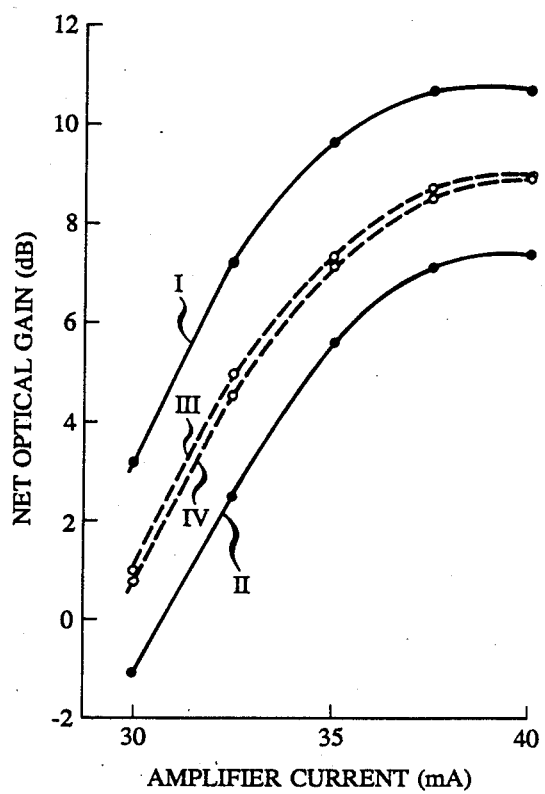
FIG. 2 is a graph of optical gain for the input polarization giving the highest gain (curves I and III) and lowest gain (curves II and IV) in a PICO amplifier apparatus (curves III and IV), and in a conventional amplifier (curves I and II) in a double-pass configuration.

The gain of the PICO amplifier apparatus was measured by coupling an amplitude modulated output from a 1.32 μm DFB laser into the amplifier chip via coupler input 14.1 and measurng the amplified output signal at coupler output 14.2 with a high-speed receiver and a RF spectrum analyzer. The DFB laser was modulated with a 01010... bit sequence at 1.7 GBit/s, and the RF power at the 850 MHz fundamental frequency was proportional to the square of the optical gain. The polarization of the input signal at port 14.1 was adjusted to give the highest and lowest gain for each measurement point. These measurements were first made without the Faraday rotator 16.1 in the optical path in order to measure the intrinsic polarization dependence of the amplifier chip as shown in FIG. 2 (solid line curves I and II). The gain for the TE mode (curve I) is shown to be about 4 dB higher than the gain for the TM mode (curve II). However, when the Faraday rotator 16.1 was inserted and the same measurements were repeated, the datapoints corresponding to the dashed lines (curves III and IV) were obtained. The gain difference between the TE and TM modes was reduced about 0.2 dB. Also note that the gain with the Faraday rotator in place is the average (in dB's) of the "best" and "worst" gain without the Faraday rotator. At 40 mA of amplifier current, the net fiber-to-fiber amplifier gain (not counting losses in the coupler 14) was 9 dB and single-pass gain was estimated to be about 13 dB.

In the PICO amplifier apparatus, where the input and output optical radiation share a common path through amplifier means 12 and rotation means 16, the input and output signals must be separated. In this experiment, coupler means 14 was a 50/50 fiber coupler which gave an excess coupling loss of 6 dB. This excess loss, however, can be reduced. If coupling means 14 comprises a well-known polarization independent optical circulator, the two signals can be separated without substantial excess loss. Such a circulator is described by W. L. Emkey, *IEEE J. Lightwave Technology*, Vol. LT-1, pp. 466–469 (1983).

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

I claim:

1. Optical amplifier apparatus for amplifying optical radiation having arbitrary polarization, amplification being independent of said polarization, said apparatus comprising
    an optical amplifier which has different gains for TE and TM modes of said optical radiation,
    means for transmitting both polarizations of said radiation essentially simultaneously through said amplifier, and
    means located external to any resonator for rotating both of said polarizations of said radiation by n90°, where n is an odd integer, after it emanates from said amplifier and for transmitting said polarization-rotated radiation through said amplifier again so that the gains of said TE and TM modes passing through said amplifier an even number of times are essentially equal.

2. The apparatus of claim 1 wherein
    said rotating means comprises a rotator and a mirror arranged in tandem with said amplifier, said rotator being effective to rotate the polarization of said radiation by 45° in a single-pass therethrough and said mirror is positioned to reflect said polarization-rotated radiation for re-transmission through said amplifier, thereby to experience another 45° of polarization rotation.

3. The apparatus of claims 1 or 2 wherein said amplifier comprises a semiconductor optical amplifier.

4. The apparatus of claim 3 wherein said amplifier is a non-resonant semiconductor optical amplifier.

5. The apparatus of claim 3 wherein said rotating means includes a Faraday optical rotator.

6. The apparatus of claim 3 wherein said transmitting means comprises an optical coupler for coupling said radiation to said amplifier.

7. The apparatus of claim 3 wherein said transmitting means comprises a polarization-independent optical circulator for coupling said radiation to said amplifier.

* * * * *